United States Patent [19]
Bowles et al.

[11] Patent Number: 5,891,754
[45] Date of Patent: Apr. 6, 1999

[54] METHOD OF INSPECTING INTEGRATED CIRCUIT SOLDER JOINTS WITH X-RAY DETECTABLE ENCAPSULANT

[75] Inventors: Philip Harbaugh Bowles, Carmel; Michael Livingston Shipman, Kokomo, both of Ind.

[73] Assignee: Delco Electronics Corp., Kokomo, Ind.

[21] Appl. No.: 798,260

[22] Filed: Feb. 11, 1997

[51] Int. Cl.$^6$ ............ H01L 21/44; H01L 21/48; H01L 21/50
[52] U.S. Cl. .......... 438/108; 438/106; 438/107; 438/126
[58] Field of Search ............... 438/108, 126, 438/106, 107

[56] References Cited

U.S. PATENT DOCUMENTS

| | | | |
|---|---|---|---|
| 4,017,495 | 4/1977 | Jaffe et al. | 438/126 |
| 4,141,135 | 2/1979 | Henry et al. | 438/108 |
| 4,416,054 | 11/1983 | Thomas et al. | 438/108 |
| 4,554,458 | 11/1985 | Behringer et al. | |
| 4,604,644 | 8/1986 | Beckham et al. | 438/126 |
| 4,746,571 | 5/1988 | Kelly . | |
| 5,022,580 | 6/1991 | Pedder | 438/108 |
| 5,149,671 | 9/1992 | Koh et al. | 438/108 |
| 5,284,796 | 2/1994 | Nakanishi et al. | 43/18 |
| 5,341,564 | 8/1994 | Akhavain et al. | 438/108 |
| 5,391,514 | 2/1995 | Gall et al. | 438/108 |
| 5,469,333 | 11/1995 | Ellerson et al. | 438/126 |
| 5,473,814 | 12/1995 | White | 438/108 |
| 5,534,465 | 7/1996 | Frye et al. | 438/108 |
| 5,728,606 | 3/1998 | Laine et al. | 438/108 |

*Primary Examiner*—Kevin M. Picardat
*Assistant Examiner*—Deven Collins
*Attorney, Agent, or Firm*—Jimmy L. Funke

[57] ABSTRACT

A method and encapsulation material for encapsulating the solder joints of an IC device mounted on the substrate of an electronic circuit assembly. The encapsulation material is formulated to be sufficiently opaque to x-radiation to enable the use of x-radiation imaging techniques to detect air pockets and voids in the encapsulation material that might degrade the fatigue life properties of the solder joints encapsulated by the encapsulation material. For the purpose of enhancing the fatigue life properties of the solder joints, the encapsulation material contains a filler material dispersed in a polymeric material, such as an epoxy, such that the encapsulation material is characterized by a coefficient of thermal expansion approximately equal to that of the solder joints. The filler material contains a sufficient amount of an element to render the encapsulation material opaque to x-radiation. Generally, suitable elements are those having an atomic number of at least about 35, such as lead, barium, zirconium, mercury, bismuth, tantalum, tin and tungsten. The element may be present as an oxide, particularly if the filler material is glass microspheres.

7 Claims, 1 Drawing Sheet

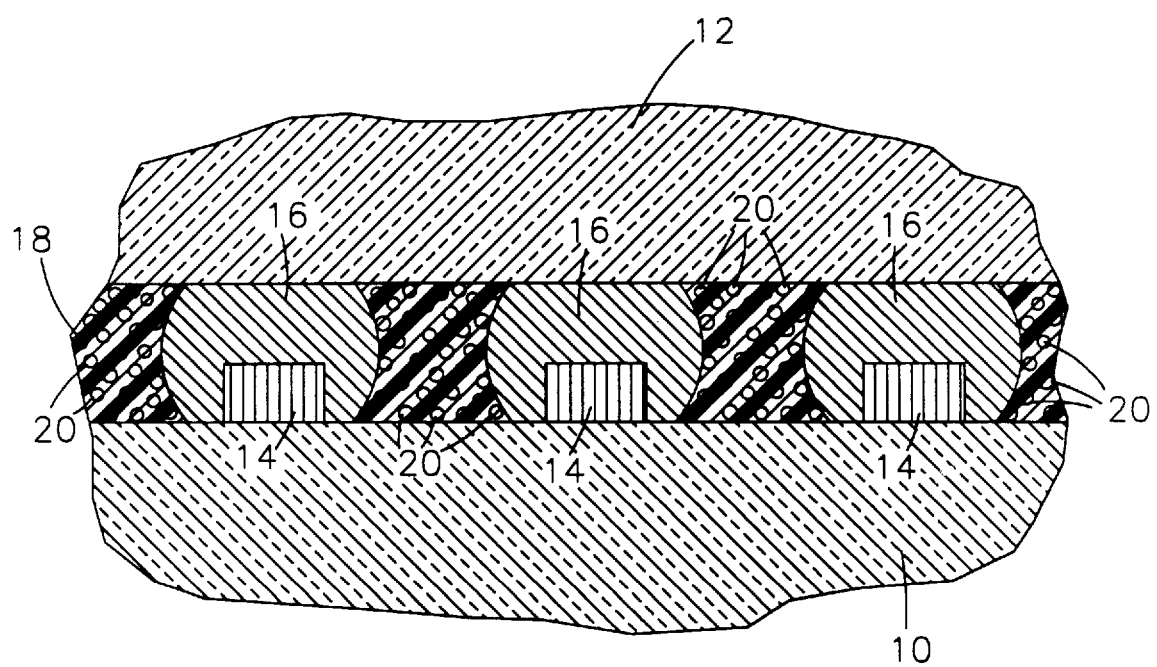

METHOD OF INSPECTING INTEGRATED CIRCUIT SOLDER JOINTS WITH X-RAY DETECTABLE ENCAPSULANT

The present invention generally relates to techniques for improving solder joint fatigue life of integrated circuit components. More particularly, this invention relates to an encapsulation material for flip chip circuit components, in which the encapsulation material has pre-cure flow characteristics that enable the material to flow sufficiently beneath a flip chip to encapsulate the solder joints of the flip chip, and in which the encapsulation material contains a filler material that renders the encapsulation material opaque to x-radiation to enable voids in the encapsulation material to be detected by in-line inspection.

BACKGROUND OF THE INVENTION

Electronic circuit assemblies are often required to be capable of surviving in hostile service environments, including those commonly found in automotive and aerospace applications. Such assemblies often employ flip chip integrated circuits (IC), which are generally characterized as being electrically and mechanically attached to an electronic circuit assembly with a number of solder joints. The solder joints are typically formed by solder bumps that were registered with conductor traces on the substrate surface of the assembly, and then reflowed to bond the flip chip to the traces. The solder joints are subject to thermal stresses as a result of temperature fluctuations in the service environment of the assembly, and differences in coefficients of thermal expansion of the various materials that form the flip chip, substrate and solder joints, which are typically silicon, alumina and a tin-lead alloy, respectively. These thermal stresses can potentially fatigue and fracture the solder joints, particularly if the assembly is subject to many temperature excursions, high temperatures on the order of 125° C. or more, or intense vibration. Under such conditions, the expected life of the solder joints can be significantly decreased.

The above is aggravated as the size of the flip chip increases, which produces larger dimensional changes relative to a given temperature change. Even greater mismatches arise from current technology in which organic materials are used to form the substrates to which flip chips are mounted organic materials such as epoxy/glass, polyimide/glass and epoxy/aramid, tend to have a larger coefficient of thermal expansion mismatch with the silicon material of flip chips as compared to traditional ceramic substrate materials, and therefore their use tends to encourage thermal cycle fatigue fractures of the solder joints.

Improved solder joint life has been achieved by encapsulating solder joints with an encapsulation material having a coefficient of thermal expansion approximately equal to that of the solder joint material, e.g., within about 20 percent of the coefficient of thermal expansion of the solder joint to be encapsulated. Because the solder joints of a flip chip are beneath the chip and support the chip above the surface of the substrate, the encapsulation material must have adequate pre-cure flow characteristics to enable the material to be drawn by capillary forces beneath the chip and between adjacent solder joints to completely encapsulate each solder joint. Suitable encapsulation materials for this purpose have been formed by epoxies in which a glass filler material is dispersed in order to reduce the coefficient of thermal expansion of the material to a value closer to that of the solder joint material. Because gaps on the order of about 0.1 millimeter (about 4 mils) or less are typical between flip chips and their substrates, there is a tendency for non-uniform flow of the encapsulation material to trap air in pockets beneath the flip chip. If an air pocket forms a void at or near a solder joint, the thermal cycle fatigue life of the solder joint will likely be adversely affected. However, the location of the solder joints beneath the flip chip and the small gap between the flip chip and its substrate make visual inspection impossible.

Accordingly, it would be desirable if an inspection technique were available that could detect air pockets and voids in an encapsulation material used to encapsulate the solder joints of an IC device. Such a technique would preferably be amenable to in-line processing methods, and entail an encapsulation material that facilitates the inspection technique yet is compatible with the preferred flip chip, solder joint and substrate materials, particularly in terms of coefficient of thermal expansion, even if the substrate material is an organic laminate.

SUMMARY OF THE INVENTION

It is an object of this invention to provide a material for encapsulating the solder joints of an IC device.

It is another object of this invention that such a material is formulated to be sufficiently opaque to x-radiation to enable an inspection technique in which x-radiation imaging is used to detect air pockets and voids in the material once the material has been applied around the solder joints of a flip chip.

It is a further object of this invention that the material has adequate opacity to x-radiation in order to permit the inspection technique to be used with inline automated processing methods.

In accordance with a preferred embodiment of this invention, these and other objects and advantages are accomplished as follows.

According to the present invention, an encapsulation material is provided for encapsulating the solder joints of an IC device mounted on the substrate of an electronic circuit assembly. The encapsulation material is formulated to be sufficiently opaque to x-radiation in order to enable the detection of air pockets and voids in the encapsulation material that might otherwise degrade the fatigue life properties of the solder joints encapsulated by the encapsulation material.

For this purpose, in addition to having a coefficient of thermal expansion approximately equal to, e.g., within about 20 percent of, that of the solder joints, the encapsulation material is formulated to contain a sufficient amount of at least one element to render the encapsulation material at least partially opaque to x-radiation. Generally, suitable elements are those having an atomic number of at least about 35, such as lead, barium, zirconium, mercury, bismuth, tantalum, tin and tungsten. The encapsulation material preferably contains at least about 10 weight percent of one or more of such elements in order to achieve adequate opacity. The element may be present as an oxide, and may be provided as a constituent of a filler material, such as glass spheres, dispersed in the encapsulation material.

In use, the encapsulation material of this invention makes possible a method for automated in-line inspection of flip chip circuit assemblies. The method generally entails encapsulating the solder joints with the encapsulation material under suitable conditions, and then detecting the extent to which the encapsulation material encapsulates the solder joints by inspection with an x-radiation imaging technique.

Because the encapsulation material of this invention is rendered partially opaque to x-radiation by the presence of an element of relatively high atomic number, air pockets and voids can be detected in the encapsulation material beneath the flip chip. As such, voids adjacent the solder joints of the flip chip can be immediately detected in order to identify solder joints that are potentially vulnerable to fatigue failure, as well as permit appropriate in-line adjustments to be made to the encapsulation process in order to achieve more complete encapsulation of the solder joints. The result is greater reliability for circuit assemblies in terms of solder joint fatigue life.

Other objects and advantages of this invention will be better appreciated from the following detailed description.

BRIEF DESCRIPTION OF THE DRAWING

The above and other advantages of this invention will become more apparent from the following description taken in conjunction with the accompanying drawing, in which is shown, n partial cross-section, a flip chip mounted with joints to a substrate, wherein the solder joints are encapsulated with an encapsulation material in accordance with this invention.

DETAILED DESCRIPTION OF THE INVENTION

The FIGURE represents a typical application for an encapsulation material in accordance with this invention, and further serves to illustrate some of the general concepts of this invention. Shown in the FIGURE is a circuit substrate 10 on which is mounted a flip chip integrated circuit (IC) device, or "flip chip" 12. The substrate 10 may be a ceramic material such as alumina, or an organic material such as an epoxy/glass laminate. As is conventional, the flip chip 12 is electrically and physically connected to the substrate 10 with a number of solder joints 16 formed by solder bumps of a solder material such as a tin-lead alloy, though various solder compositions could foreseeably be used. As is conventional, the solder bumps are reflowed to allow the solder to wet and metallurgically bond to conductor pads 14 on the surface of the substrate 10. The pads 14 are typically formed from a copper alloy or another suitably conductive alloy, though it is foreseeable that other electrically-conductive materials could be used to form the pads 14. As shown, the solder joints 16 support the flip chip 12 above the surface of the substrate 10, forming a gap between the substrate 10 and flip chip 12 on the order of about 0.1 millimeter, though larger and smaller gaps are common.

The above-described application is merely intended to represent generally conventional circuit assemblies. Therefore, the teachings of this invention are not limited to the specific configuration shown in the Figure, and are equally applicable to electronic assemblies that utilize essentially any type and combination of circuit components that are supported above the surface of a substrate with one or more solder joints. Accordingly, those skilled in the art will recognize that numerous variations of the illustrated electronic assembly are possible, all of which are within the scope of this invention.

Because of the differences in materials used to form the substrate 10, flip chip 12, pads 14 and solder joints 16, a mismatch in coefficients of thermal expansion exists. This mismatch generates stresses during temperature excursions that are primarily concentrated in the solder joints 16. To mitigate the adverse effect of such stresses, an encapsulant 18 is shown as being deposited on the substrate 10 and around the solder joints 16. Beneath the flip chip 12, the encapsulant 18 will generally have a thickness dictated by the gap between the substrate 10 and flip chip 12, e.g., about 0.1 millimeter. As will be discussed below, adequate distribution of the encapsulant 18 around the solder joints 16 is achieved by formulating the pre-cure encapsulation material to have a sufficiently low viscosity. By ensuring adequate encapsulation of the solder joints 16, i.e., the absence of air pockets and voids around and adjacent the solder joints 16, a drastic improvement in fatigue life for the solder joints 16 can be achieved.

Specific characteristics required of the encapsulant 18 of this invention include the following. First, the encapsulant 18 preferably has a coefficient of thermal expansion within about 20 percent of that of the solder composition that forms the solder joints 16 in order to avoid an excessive thermal mismatch with the solder joints 16. In addition, the pre-cure encapsulation material that forms the encapsulant 18 must have a sufficiently low viscosity, generally not more than about 50,000 centipoise, at the desired dispensing temperature in order for the material to flow freely between the solder joints 16, though it is foreseeable that different viscosities may be acceptable, depending on the application method, the lead pitch, the gap between the substrate 10 and chip 12, and the surface area to be covered. Furthermore, the encapsulant 18 must be suitable for the intended environment of the electronic assembly, which generally necessitates a relatively low density, high modulus and fracture toughness, and some degree of resistance to chemical attack and elevated temperatures. Finally, and as a key aspect of this invention, the resulting encapsulant 18 must be sufficiently opaque to x-radiation in order for voids within the encapsulant 18 to be visible by an x-radiation imaging technique.

According to the present invention, the above characteristics are achieved with an encapsulation material composed of an epoxy in which is dispersed one or more dopant elements having an atomic number of about 35 or more. As is conventional, the encapsulation material will also contain a filler material and a curative that triggers a cure at an elevated temperature, though it is foreseeable that other types of curatives could be used. The filler material may be any suitable substance capable of yielding the desired flow, electrical, mechanical and thermal properties for the encapsulation material. In a preferred embodiment, the filler material is also formulated to contain an adequate amount of the one or more dopant elements that yield the desired x-radiation opacity for the encapsulant 18. Elements that are suitable as the dopant include lead, barium, zirconium, mercury, bismuth, tantalum, tin and tungsten, as well as compounds thereof. Notably, since x-radiation opacity is a function of the atomic number of the dopant element and the amount of the dopant element in the encapsulant 18, the chemical arrangement of the dopant element (or elements, if more than one is used) is not critical. As such, the dopant element or elements can be present in their elemental form, or in convenient and non-reactive compounds such as oxides, carbides, sulfides, etc. In addition, suitable bromide and/or iodide compounds would also enhance the x-radiation opacity of the encapsulant 18. Notable limitations to selection of the dopant element include the density of the element, which must not detrimentally alter the flow characteristics of the encapsulation material, the coefficient of thermal expansion, which must balance that of the polymeric constituents of the encapsulant 18, and the rate of α-particle emission, which must be extremely low in order to render the encapsulant 18 safe for use in proximity to IC electronics, especially memory circuitry.

In a preferred embodiment, the filler material is glass microspheres 20 (as represented in the FIGURE) containing a relatively large amount of lead oxide (flint glass) or barium oxide as the dopant element. Suitable materials for the remainder of the filler material include silicon dioxide, boric oxide and magnesium oxide, either individually or in combination. To attain the required flow characteristics and coefficient of thermal expansion for the encapsulation material, the glass microspheres preferably constitute up to about 70 weight percent of the encapsulation material, though this range may vary depending on the physical properties of the microspheres. Furthermore, other suitable filler materials could be used with this invention, which might also result in the filler content of the encapsulation material differing from the above-stated range. As is generally conventional, the glass particles can be surface-treated with a coupling agent to improve wetting and adhesion of the epoxies.

Advantageously, spherical glass materials can be commercially produced to contain oxides, such as lead and barium oxide, desired for contributing the x-radiation opacity of the encapsulant 18 of this invention. Suitable encapsulation materials in accordance with this invention contain at least about 40 weight percent, and preferably at least about 50 weight percent of a spherical glass material that comprises at least about 20 weight percent lead oxide or barium oxide. In addition, spherical glass materials are available in discrete particle sizes, which enables different particle sizes to be blended in appropriate proportions so that smaller particles will fit in the interstices formed by the larger particles. With this packing technique, the required coefficient of thermal expansion of the encapsulation material can be attained while retaining the necessary flow characteristics for the material.

The epoxy is typically a liquid epoxy such as a mixture of cycloaliphatic, bisphenol A and bisphenol F resins, and preferably constitutes about 30 weight percent or more of the encapsulation material. Preferred epoxy resins, such as those noted, are characterized by relatively low coefficients of thermal expansion and resistance to heat and chemicals. As noted above, the curative required for the epoxy can be of any suitable type, such as a heat-activated anhydride curative, with or without a catalyst. Other than viscosity, coefficient of thermal expansion, and resistance to hostile thermal and chemical environments, the particular composition of the polymer and curative for the encapsulation material of this invention is generally not critical. The coefficient of thermal expansion of the polymer will affect the amount of filler material required to suitably obtain a coefficient of thermal expansion for the encapsulation material that is preferably within about 20 percent of the alloy that forms the solder joints 16.

Formulations for the encapsulation material of this invention that have been evaluated for x-radiation opacity include the following:

| Ingredients | Formulations (in weight %) | | |
|---|---|---|---|
| | A | B | C |
| Epoxy | 31 | 30 | 31 |
| Curative | 30 | 29 | 25 |
| Glass (²20 μm dia.) | | | |
| o60% PbO glass | 39 | — | — |
| o30% PbO glass | — | 41 | — |
| o30% BaO glass | — | — | 44 |
| Dopant Content[1]: | 22 | 13 | 12 |

Note 1: The calculated effective dopant element content (elemental lead or barium) of the encapsulation material in weight percent.

The above encapsulation materials were mixed and applied to circuit boards, after which flip chips bumped with approximately 0.1 millimeter (about 4 mils) solder bumps were pressed into the materials to yield encapsulants whose thicknesses were equal to the solder bump height.

After curing, the assemblies were x-rayed using high-resolution x-radiation imaging equipment. Conditions for imaging included a low x-ray voltage, high x-ray current, high image processor gain, and some gray scale stretch (e.g., about 150 gray levels) on the image processor output. Sixty kilovolts x-ray voltage provided maximum contrast, resulting in a contrast of about 10 gray levels between the encapsulant and voids within the encapsulant.

From the above, it was determined that the above formulations for the encapsulation material met the criteria established for the encapsulant of this invention in terms of approximate material compatibility and opacity to x-radiation. In particular, the presence of one or more of the preferred elements at the stated levels in the encapsulation material provides for a sufficient gray level contrast when examined by x-radiation imaging techniques to enable such techniques for use in real-time, in-line operations that permit automated void recognition in circuit assemblies, as well as off-line process setup and audit capabilities. X-radiation imaging also permits the solder joints and any other electrical interconnections between circuit components and the substrate to be simultaneously inspected. Finally, the present invention is particularly useful for inspecting flip chips on organic laminate substrates which, due to greater mismatches in coefficients of thermal expansion, are particularly susceptible to solder joint fatigue if adequate encapsulation of each flip chip solder joint is not achieved.

While our invention has been described in terms of a preferred embodiment, it is apparent that other forms could be adopted by one skilled in the art. For example, the encapsulation method could be employed to encapsulate the leads and solder joints of IC devices other than flip chips, appropriate polymeric materials which achieve the desired characteristics of the polymeric constituent of the encapsulation material could be substituted for the disclosed epoxy, and other elements and compounds having adequate opacity to x-radiation could be employed. Accordingly, the scope of our invention is to be limited only by the following claims.

The embodiments of the invention in which an exclusive property or privilege is claimed are defined as follows:

1. A method for inspecting an electronic assembly having an integrated circuit device mounted to a substrate with solder joints, the method comprising the steps of:
   forming an encapsulation material to comprise at least one element having an atomic number of at least about 35 so as to render the encapsulation material at least partially opaque to x-radiation;
   encapsulating the solder joints with the encapsulation material; and
   detecting the extent to which the encapsulation material encapsulates the solder joints by inspection with an x-radiation imaging technique.

2. A method as recited in claim 1 wherein the encapsulation material comprises at least about 10 weight percent of the at least one element.

3. A method as recited in claim 1 wherein the at least one element is one or more elements chosen from the group consisting of lead, barium, zirconium, mercury, bismuth, tantalum, tin and tungsten.

4. A method as recited in claim 1 wherein the at least one element is present as an oxide.

5. A method as recited in claim 1 wherein the encapsulation material further comprises a filler material.

6. A method as recited in claim 5 wherein the filler material is glass microspheres containing the at least one element, the encapsulation material comprising at least about 40 weight percent of the filler material, the filler material comprising at least about 20 weight percent lead oxide or barium oxide.

7. A method as recited in claim 1 wherein the device is a flip chip and the substrate is an organic laminate.

* * * * *